(12) United States Patent
Kim et al.

(10) Patent No.: US 12,264,958 B1
(45) Date of Patent: Apr. 1, 2025

(54) SYSTEM AND METHOD FOR MEASURING LOAD OF VEHICLE USING OPTIMAL RESONANT FREQUENCY SEARCH WIRELESS POWER TRANSMISSION SYSTEM

(71) Applicant: BANF CO., LTD., Seoul (KR)

(72) Inventors: Young Sun Kim, Gunpo-si (KR); Sung Han You, Seoul (KR); Ji Young Song, Sejong-si (KR)

(73) Assignee: BANF CO., LTD., Seoul (KR)

( * ) Notice: Subject to any disclaimer, the term of this patent is extended or adjusted under 35 U.S.C. 154(b) by 0 days.

(21) Appl. No.: 18/845,866

(22) PCT Filed: Jan. 25, 2023

(86) PCT No.: PCT/KR2023/001090
§ 371 (c)(1),
(2) Date: Sep. 10, 2024

(87) PCT Pub. No.: WO2023/182638
PCT Pub. Date: Sep. 28, 2023

(30) Foreign Application Priority Data

Mar. 22, 2022 (KR) .......................... 10-2022-0035507

(51) Int. Cl.
*G01G 19/12* (2006.01)
*G01B 7/02* (2006.01)
(Continued)

(52) U.S. Cl.
CPC .............. *G01G 19/12* (2013.01); *G01G 7/00* (2013.01); *H02J 50/12* (2016.02); *G01B 7/023* (2013.01)

(58) Field of Classification Search
CPC ........... G01G 7/00; G01G 19/12; H02J 50/12; G01B 7/023
See application file for complete search history.

(56) References Cited

U.S. PATENT DOCUMENTS

| 3,428,139 A | * | 2/1969 | Nolan | ..................... G01S 15/88 |
| | | | | 177/210 R |
| 3,508,623 A | * | 4/1970 | Greenstein | ............... G01G 9/00 |
| | | | | 177/210 R |

(Continued)

FOREIGN PATENT DOCUMENTS

| JP | H09-061226 A | 3/1997 |
| JP | 2004-127276 A | 4/2004 |

(Continued)

OTHER PUBLICATIONS

International Search Report in International Application No. PCT/KR2023/001090, dated Aug. 8, 2024, 2pages.

*Primary Examiner* — Randy W Gibson
(74) *Attorney, Agent, or Firm* — Park, Kim & Suh, LLC

(57) ABSTRACT

The present invention provides a system and method for measuring the load of a vehicle using an optimal resonant frequency search wireless power transmission system, wherein a wireless power transmission system, which has maximum power transmission efficiency due to effectively searching for an optimal resonant frequency by varying system frequency, is provided in order to supply wireless power to various sensors mounted on wheels and wheel housings, etc. of the vehicle, and the load can be accurately and effectively measured by using the wireless power transmission system without additional sensors or devices.

14 Claims, 14 Drawing Sheets

(51) Int. Cl.
    *G01G 7/00*         (2006.01)
    *H02J 50/12*       (2016.01)

(56) References Cited

U.S. PATENT DOCUMENTS

| | | | | |
|---|---|---|---|---|
| 4,623,029 | A * | 11/1986 | Bambauer | G01G 19/08 177/210 R |
| 4,789,033 | A * | 12/1988 | Dohrmann | G01G 19/08 177/244 |
| 5,522,468 | A * | 6/1996 | Dohrmann | G01G 19/08 177/136 |
| 8,552,741 | B2 * | 10/2013 | Wuidart | B60C 23/068 327/522 |
| 11,590,818 | B2 * | 2/2023 | Gröger | G01B 7/14 |
| 2023/0266113 | A1 * | 8/2023 | Choi | G01B 7/023 73/115.02 |

FOREIGN PATENT DOCUMENTS

| | | |
|---|---|---|
| JP | 6352289 B2 | 7/2018 |
| KR | 10-2006-0006269 A | 1/2006 |
| KR | 10-2007-0074854 A | 7/2007 |
| KR | 10-2351949 B1 | 1/2022 |

\* cited by examiner

SYSTEM AND METHOD FOR MEASURING LOAD OF VEHICLE USING OPTIMAL RESONANT FREQUENCY SEARCH WIRELESS POWER TRANSMISSION SYSTEM

CROSS-REFERENCE TO RELATED APPLICATIONS

This application is the National Stage filing under 35 U.S.C. 371 of International Application No. PCT/KR2023/001090, filed on Jan. 25, 2023, which claims the benefit of Korean Patent Application No. 10-2022-0035507, filed on Mar. 22, 2022, the contents of which are all hereby incorporated by reference herein in their entirety.

TECHNICAL FIELD

The present invention relates to a system and method for measuring a load of a vehicle. More specifically, the present invention relates to a system and method for accurately and efficiently measuring a load of a vehicle without the installation of additional devices, as well as providing a power transmission system capable of supplying power.

BACKGROUND ART

A load is an external force exerted on an object or structure, in which case the external force is usually gravity. In general, a sensor that measures a load attaches a metal foil-type strain gauge to a load cell, and a small change in resistance of the strain gauge due to a change in load (force) is amplified in an electronic circuit and made into a large change in signal, and is used in the overall industries.

However, the load cell, which is a sensor that measures a load, usually uses 4 to 5 lines, such as one shield line in addition to two power lines and two signal lines, and the length of the line, and the introduction of noise due to the installation state, and the instability of measurement due to signal errors have been pointed out as very inconvenient factors in the field.

In addition, since the metal foil-type strain gauge is used as a default structure, the change in resistance of the strain gauge according to the load (commonly referred to as a gauge factor) is very small. Therefore, in addition to the disadvantage of requiring a high-performance amplification circuit, it is inconvenient to install an additional temperature compensation circuit because there is a large fluctuation in the sensor value depending on the temperature.

Recently, a wireless load sensor that incorporates wireless technology into the existing wired type of load cell has been used, and measurement errors caused by wires and inconvenience of installation have been largely solved, but there are still problems when applied in the field because power must be applied to the circuit and sensor.

Further, an overloaded vehicle means a vehicle that is overloaded with luggage beyond the designed load capacity, and is blamed for road damage and air pollution due to excessive emissions.

To solve this problem of overloading, authorities are applying various overload prevention systems and methods of enforcing overloaded vehicles. One of those is introducing a stationary axle weight measurement system that measures the weight of a vehicle by installing a sensor at the bottom of the road surface, and private weighbridges are also being introduced at construction sites, logistics warehouses, import and export ports, and the like, where cargo transportation is frequently carried out.

However, the measurement devices using these weighbridges are not being expanded and operated nationwide due to large budgets and problems in equipment operation, and there is a problem in that most of the overload measurement methods currently being introduced are carried out on weighbridges that are far away from the loading point.

Meanwhile, the conventional technology capable of measuring the self-weight of a vehicle may be divided into a system applied to a plate spring-type vehicle, which measures the weight of the vehicle by attaching a strain gauge to a plate spring and measuring the amount of deformation thereof, a pressure-type system, which measures the weight of the vehicle using the air pressure of an air spring, and a load cell-type system, which measures the weight of the vehicle by applying a load cell, and a hydraulic gauge-type system, which can only measure the weight of a carrying box of the vehicle.

The strain gauge installed on the plate spring is connected to a central control device of the vehicle through a cable, but there is a problem in that the cable connecting the strain gauge and the central control device is broken during the process of loading cargo on the vehicle and during the operation of the vehicle, causing difficulty in maintenance and repairs. In this regard, there is a need for a device that is capable of accurately and efficiently measuring the load of the vehicle wirelessly with ease and convenience without a problem in power supply.

DISCLOSURE

Technical Problem

The present invention is directed to providing a system and method for accurately and efficiently measuring a load with ease and without the installation of an additional device, as well as providing a power transmission system that is capable of supplying power with maximum efficiency to various sensors mounted on a vehicle and the like.

In addition, the present invention is directed to providing a system and method for easily measuring a load of a vehicle without additionally installing a load measurement device of the vehicle, which is essentially required for entering and exiting a construction site, entering a specific road or bridge, or traveling situations, and the like.

In addition, the present invention is directed to providing a system and method for effectively and quickly searching for an optimal resonant frequency for maximum power transmission in a wireless power transmission system with a magnetic resonant coupling method even when a system usage situation changes, such as a change in a transmission distance, and the like.

In addition, the present invention is directed to providing a system and method for searching for an optimal resonant frequency for maximum wireless power transmission with a simple search system and an efficient search method.

In addition, the present invention is directed to providing a system and method for searching for an optimal resonant frequency that is capable of more precisely and accurately searching for and finding an optimal resonant frequency and substantially increasing the power transmission efficiency of a wireless power transmission system.

Technical Solution

To solve the aforementioned objects, the present invention is directed to providing a method of measuring a load of a vehicle using an optimal resonant frequency search wireless power transmission system, in a method of measuring a load using a magnetic resonant wireless power transmission system that is installed in a vehicle having a vehicle height that varies according to the load of the vehicle including a loaded cargo, and is provided with a power transmission unit (Tx) and a power reception unit (Rx), the method may include: (a) searching for an optimal resonant frequency according to a change in a power transmission distance using a system frequency variation according to a change in the load of the vehicle; (b) deriving an optimal resonant frequency variation relationship according to the change in the power transmission distance; and (c) calculating an amount of change in power transmission distance from the variation relationship, and deriving the load from the amount of change in power transmission distance.

In addition, the wireless power transmission system may be a magnetic resonant wireless power transmission system provided with the power transmission unit (Tx) mounted on a wheel housing of the vehicle and the power reception unit (Rx) mounted inside a tire of the vehicle.

In addition, the method may include: determining a value of the load is determined to be an average value of a plurality of load measurement values when the power transmission unit (Tx) and the power reception unit (Rx) are installed in at least one wheel, a wheel housing surrounding the corresponding wheel, and the like, and the plurality of load measurement values are calculated.

Here, step (a) may include: (a1-1) setting a system frequency within a preset frequency variable range and transmitting power from the power transmission unit to the power reception unit; (a1-2) measuring an output voltage value of the power reception unit according to the system frequency that is set; (a1-3) determining a resonant frequency as an optimal resonant frequency when the measured output voltage value is equal to or greater than a preset receiving voltage determination value; and (a1-4) repeating steps from step (a1-1) by varying the system frequency within the frequency variable range.

In addition, step (a) may include: (a2-1) setting a system frequency within a preset frequency variable range and transmitting power from the power transmission unit to the power reception unit; (a2-2) measuring a current value and an output voltage value and an output current value of the power reception unit according to the system frequency that is set; (a2-3) calculating power transmission efficiency using a current value and voltage value of the power transmission unit measured at the resonance frequency, and an output voltage value and output current value of the power reception unit measured at the resonance frequency, when the measured output voltage value is equal to or greater than a preset receiving voltage determination value; (a2-4) repeating steps starting from step (a2-1) by varying the system frequency within the frequency variable range; and (a2-5) determining a resonance frequency of a maximum value of the calculated power transmission efficiency as an optimal resonance frequency.

Further, step (c) may include: (c1) calculating an amount of change in power transmission distance according to the variation relationship from a value of the change in the obtained optimal resonant frequency; and (c2) deriving a load of an object mounted on the vehicle using the calculated amount of change in power transmission distance and a preset suspension spring constant k of the vehicle.

Further, the receiving voltage determination value for the measured stabilization output voltage value Vr may be greater than the receiving voltage determination value for the measured DC output voltage value V.

Further, to solve the aforementioned objects, the present invention is directed to providing a system for measuring a load of a vehicle using an optimal resonant frequency search wireless power transmission system, in a system for measuring a load using a magnetic resonant wireless power transmission system that is provided with a power transmission unit (Tx) and a power reception unit (Rx) installed in a vehicle having a vehicle height that varies according to the load of the vehicle including a loaded cargo, wherein the system includes the power transmission unit (Tx) provided with an AC/DC conversion circuit, a DC/RF conversion circuit, a matching circuit, a control circuit, and a communication circuit, and the power reception unit (Rx), which is mounted inside a tire and includes a matching circuit, a rectification circuit, a stabilization circuit, a DC/DC conversion circuit, a control circuit, and a communication circuit to receive power from the power transmission unit (Tx), the system comprising: an optimal resonant frequency search wireless power transmission system configured to search for and determine an optimal resonant frequency by varying a system frequency; and a load measurement unit configured to derive an optimal frequency variation relationship according to a change in power transmission distance caused by a movement of the vehicle using a frequency variation at a time of the load change, and to measure the load from an amount of change in power transmission distance calculated from the variation relationship.

Here, the magnetic resonant wireless power transmission system may be a magnetic resonant wireless power transmission system provided with the power transmission unit (Tx) mounted on a wheel housing of the vehicle and the power reception unit (Rx) mounted inside a tire of the vehicle.

In addition, the optimal resonant frequency search wireless power transmission system may transmit, by the power transmission unit, power to the power reception unit by varying the system frequency within a preset frequency variation range, and determine at least one of resonant frequencies to be an optimal resonant frequency when an output voltage value measured in the power reception unit is equal to or greater than a preset receiving voltage determination value.

In addition, the optimal resonant frequency search wireless power transmission system may transmit, by the power transmission unit, power to the power reception unit by varying the system frequency within a preset frequency variation range, and determine a resonant frequency of a maximum value of at least one power transmission efficiency calculated using a current value and a voltage value of the power transmission unit and an output current value and an output voltage value of the power reception unit that are measured at the resonant frequency to be an optimal resonant frequency when the output voltage value measured in the power reception unit is equal to or greater than a preset receiving voltage determination value.

Further, the output voltage value may be a DC output voltage value V or a stabilization output voltage value Vr measured between the stabilization circuit and the DC conversion circuit of the power reception unit, and the current value of the power transmission unit may be an input current value A measured between the AC/DC conversion circuit and the DC/RF conversion circuit, or measured between the DC/RF conversion circuit and the matching circuit.

Advantageous Effects

According to a system and method for measuring the load of a vehicle using an optimal resonant frequency search wireless power transmission system, according to the present invention, the present invention provides a system and method that is capable of accurately and efficiently measuring a load without the installation of an additional sensor or device, as well as the present invention provides a power transmission system that effectively searches for an optimal resonant frequency by a system frequency variation in order to supply wireless power to various sensors mounted on wheels and wheel housings, etc. of the vehicle.

In addition, according to a system and method for measuring a load of a vehicle using an optimal resonant frequency search wireless power transmission system according to the present invention, a system and method are provided which is capable of accurately and efficiently measuring a transmission distance and a vehicle load using the same without adding a load sensor while supplying power having an optimal transmission efficiency to various sensors mounted on a vehicle and the like.

In addition, according to a method of searching for an optimal resonant frequency for maximum power transmission according to the present invention, a system and method for searching for an optimal resonant frequency for wireless power transmission is provided with a simple search system and an effective search method by measuring an output voltage value according to a frequency variation within a preset system frequency in a wireless power transmission system using magnetic resonant coupling of a power transmission unit and a power reception unit, and determining an optimal resonant frequency when the measured output voltage value is equal to or greater than a preset determination value.

In addition, a method of searching for an optimal resonant frequency for maximum power transmission according to the present invention calculates power transmission efficiency using a current value of a transmitting unit and a current and voltage values of a power reception unit, and proposes a search method for determining a resonant frequency at a maximum value among the calculated values of power transmission efficiency as an optimal resonant frequency having maximum power transmission efficiency, thereby providing a system and method for searching for an optimal resonant frequency that is capable of more precisely and accurately searching for and finding an optimal resonant frequency that can substantially increase the power transmission efficiency of a wireless power transmission system.

In addition, a method of searching for an optimal resonant frequency for maximum power transmission according to the present invention provides a system and method for varying a power transmission distance at a preset variable interval within a preset range of power transmission distances over which magnetic resonant coupling is possible and searching for an optimal resonant frequency, thereby providing a system and method for searching for an optimal resonant frequency for efficient maximum power transmission that can be applied in an environment where the power transmission distance changes or to various systems or home appliances.

MODE FOR DISCLOSURE

Figure 1:
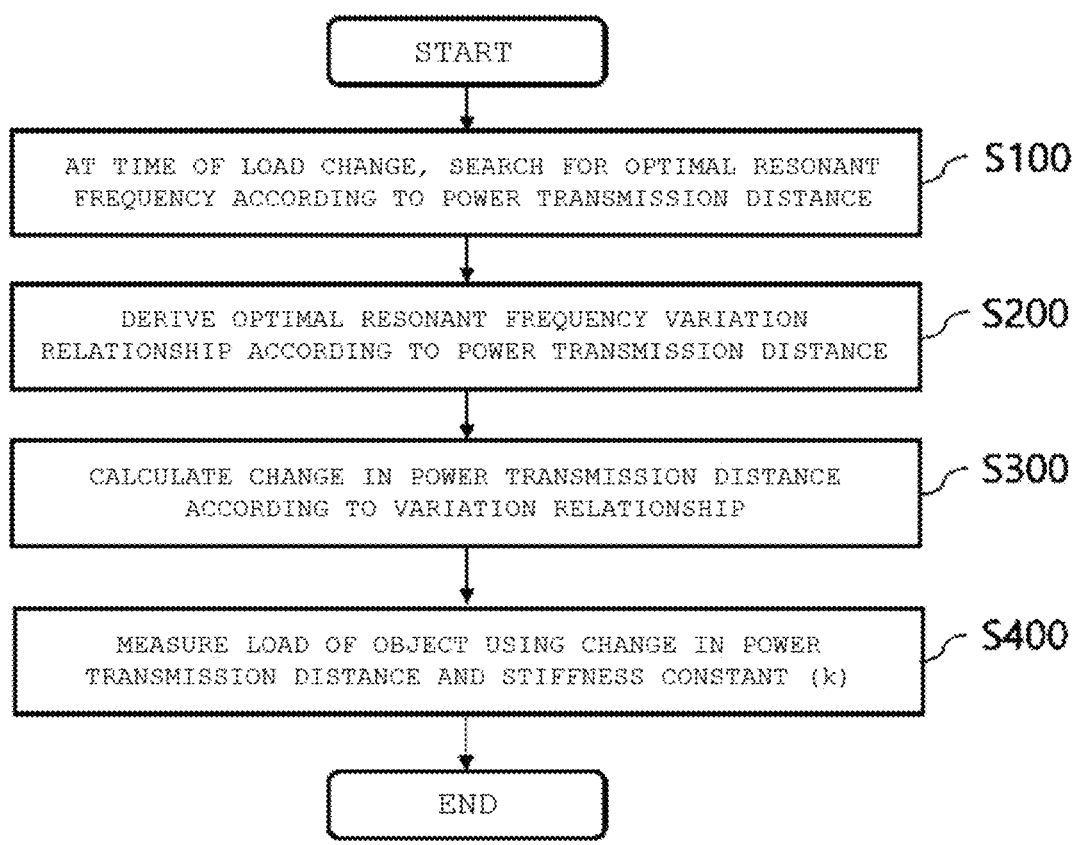
FIG. 1 is a flowchart of a method of measuring a load using an optimal resonant frequency search wireless power transmission system according to an embodiment of the present invention.

Hereinafter, exemplary embodiments of the present invention will be described in detail with reference to the accompanying drawings. However, the present invention is not limited to the exemplary embodiments to be described below and may be specified as other aspects. On the contrary, the embodiments introduced herein are provided to make the disclosed content thorough and complete, and sufficiently transfer the spirit of the present invention to those skilled in the art. Like reference numerals indicate like constituent elements throughout the specification.

Hereinafter, the exemplary embodiments of the present invention will be described in detail with reference to the accompanying drawings.

Figure 2:
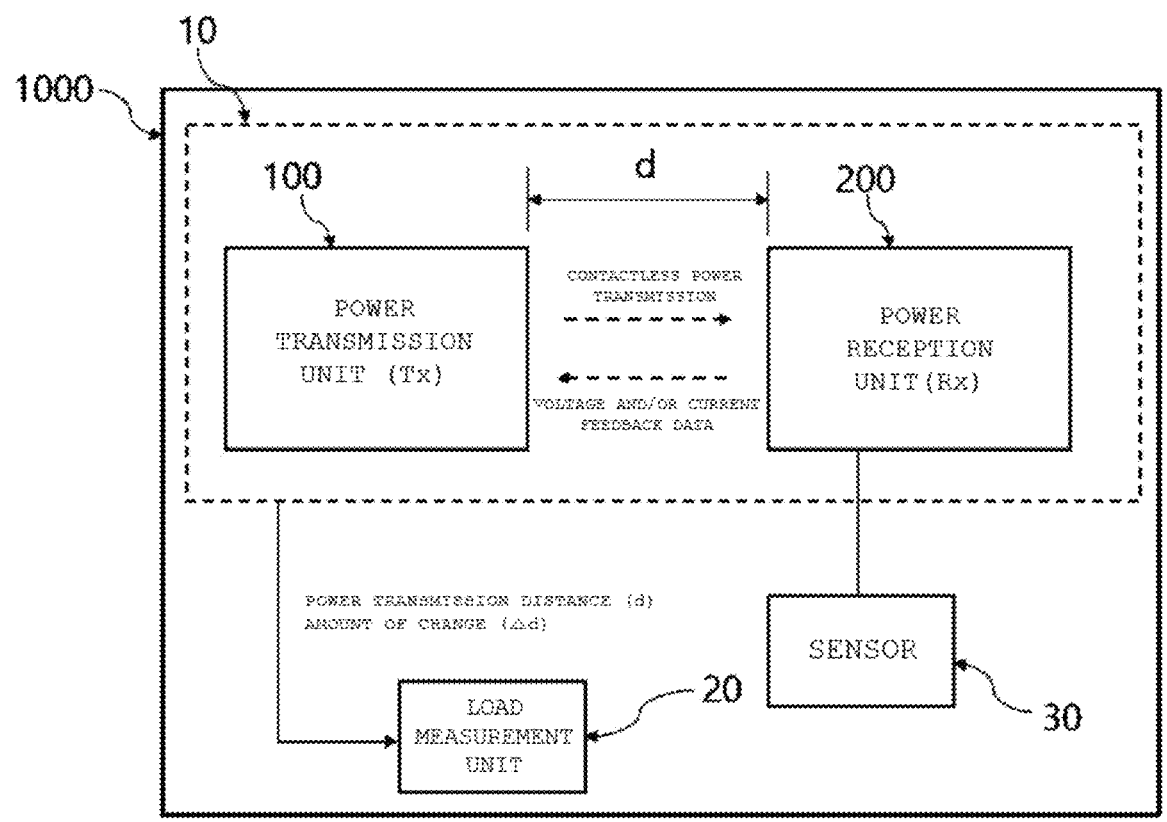
FIG. 2 is a schematic view illustrating a block diagram of a system for measuring a load using an optimal resonant frequency search wireless power transmission system, according to an embodiment of the present invention.
Figure 3:
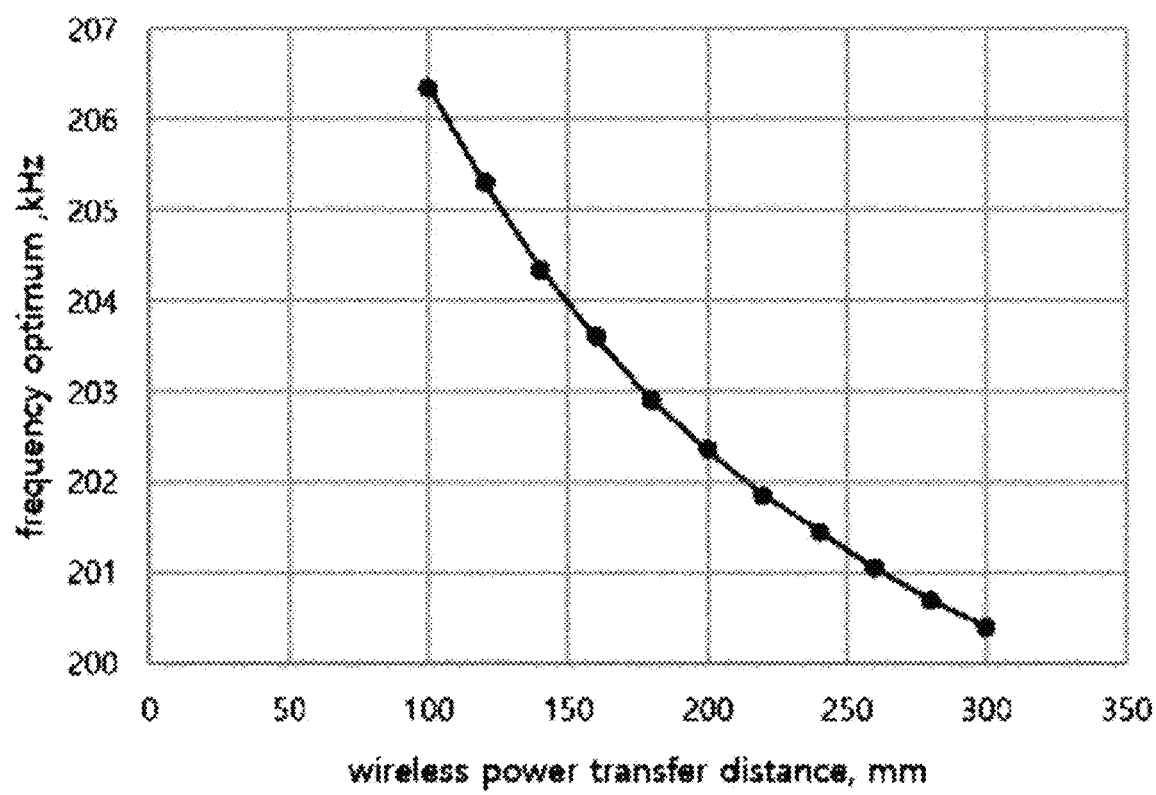
FIG. 3 illustrates a schematic view of a graph representing the relationship between an optimal resonant frequency and a power transmission distance, resulting from applying a system and method for searching for the optimal resonant frequency, as an embodiment of the present invention.
Figure 4:
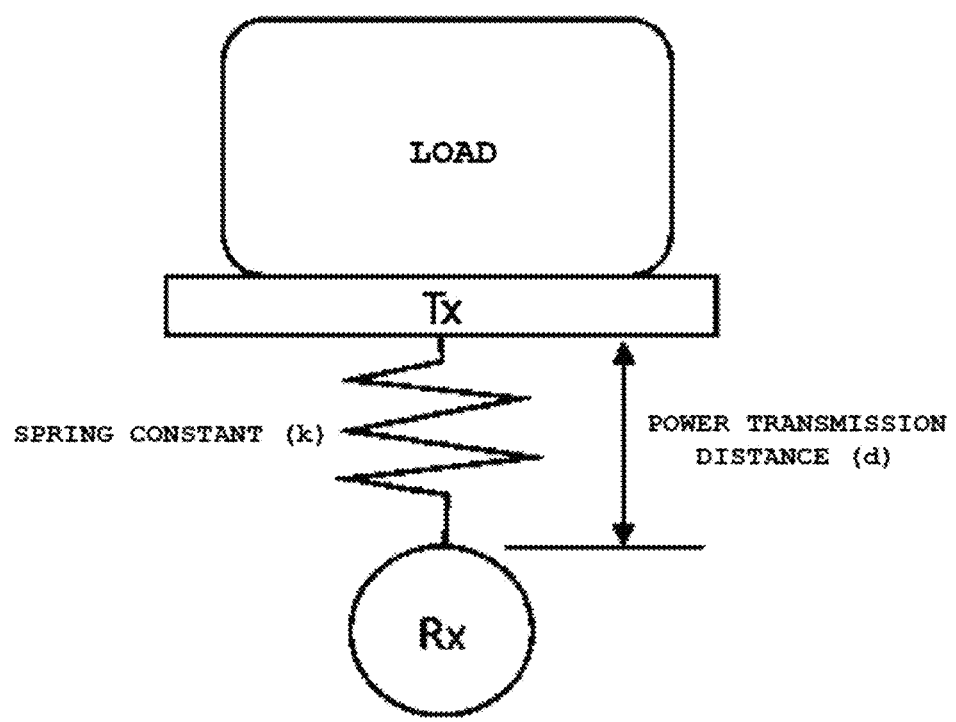
FIG. 4 is a conceptual view illustrating an amount of change in the power transmission distance of a power transmission unit (Tx) and a power reception unit (Rx) depending on a load carried on a vehicle.
Figure 5:
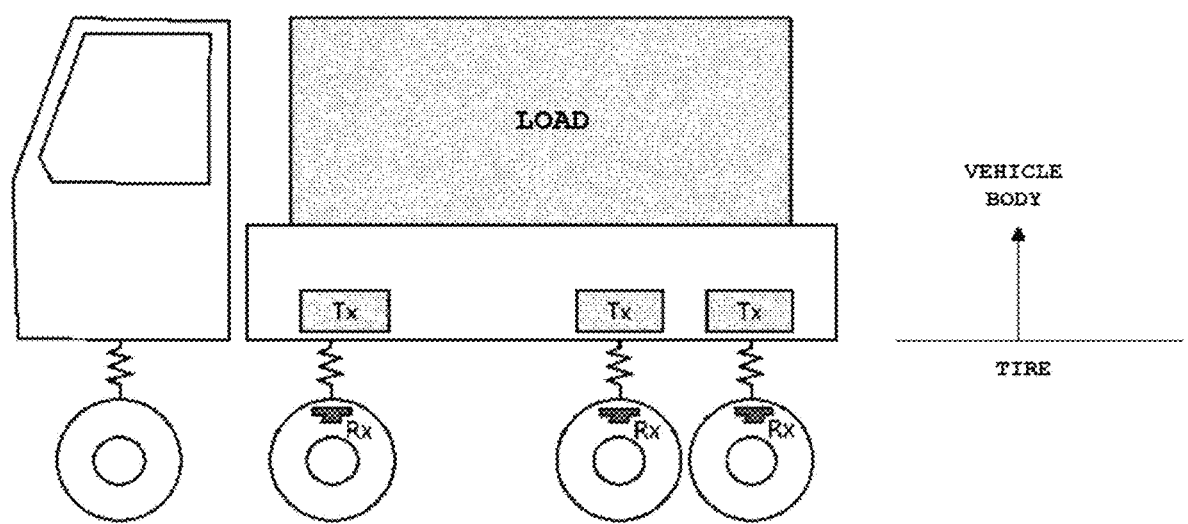
FIG. 5 is a schematic view illustrating an example of an application of the system and method for measuring a load of a vehicle using the optimal resonant frequency search wireless power transmission system to a vehicle, according to an embodiment of the present invention.

FIG. 1 is a flowchart of a method of measuring a load using an optimal resonant frequency search wireless power transmission system 10 according to an embodiment of the present invention, FIG. 2 is a schematic view illustrating a block diagram of a system 1000 for measuring a load using the optimal resonant frequency search wireless power transmission system 10, according to an embodiment of the present invention, FIG. 3 illustrates a schematic view of a graph representing the relationship between an optimal resonant frequency and a power transmission distance d, resulting from applying a system and method for searching for the optimal resonant frequency, as an embodiment of the present invention, FIG. 4 is a conceptual view illustrating an amount of change in the power transmission distance d of a power transmission unit (Tx) 100 and a power reception unit (Rx) 200 depending on a load carried on a vehicle, and FIG. 5 is a schematic view illustrating an example of an application of the system 1000 and method for measuring a load of a vehicle using the optimal resonant frequency search wireless power transmission system 10 to a vehicle, according to an embodiment of the present invention.

As illustrated in FIG. 1, a method of measuring a load using the optimal resonant frequency search wireless power transmission system 10 according to an embodiment of the present invention, may include, in the method of measuring a load using the magnetic resonant wireless power transmission system 10, provided with the power transmission unit (Tx) 100 and the power reception unit (Rx) 200 installed in a vehicle having a variable vehicle height depending on a load of the vehicle including a loaded cargo, (a) searching for an optimal resonant frequency according to a change in the power transmission distance d using a system frequency variation at a time of the load change (S100), (b) deriving an optimal resonant frequency variation relationship according to a change in the power transmission distance d (S200), and (c) calculating an amount of change in the power transmission distance d from the variation relationship (S300), and deriving the load from the amount of change in the power transmission distance d (S400).

In the present invention, wireless power may be supplied to sensors that are mounted in a position in which a wired power supply is difficult in a vehicle and are powered by a battery or the like, such as an air pressure sensor mounted on wheels or the like, so that separate wires, batteries, or the like may be omitted, and the load of the vehicle may be measured on the basis of data derived through a frequency search process in the process of supplying optimal wireless power from the power transmission unit mounted on a wheel housing to a sensor (air pressure sensor or the like) that is mounted inside a wheel or a tire and is powered by the power reception unit.

In the case of a vehicle, the vehicle height may be changed depending on the load of a loaded cargo. Accordingly, a resonant frequency of the wireless power transmitted from the power transmission unit to the power reception unit needs to be changed. In the present invention, the load of the vehicle may be measured on the basis of data obtained in the process of adjusting the resonant frequency.

Therefore, as illustrated in FIG. 2, the system 1000 for measuring a load using the optimal resonant frequency search wireless power transmission system 10 according to an embodiment of the present invention, may include, in the system 1000 of measuring a load using the magnetic resonant wireless power transmission system 10, the optimal resonant frequency search wireless power transmission system 10 provided with the power transmission unit (Tx) 100 and the power reception unit (Rx) 200 receiving power from the power transmission unit (Tx) 100 to search for and determine an optimal resonant frequency by varying a system frequency, and a load measurement unit 20 that derives an optimal frequency variation relationship according to a change in the power transmission distance d using the frequency variation according to a change in load, and measures the load from the amount of change in the power transmission distance d calculated from the variation relationship may be included.

The power reception unit (Rx) 200, which constitutes the wireless power transmission system 10 installed in the vehicle, may supply the received power to a sensor 30 or the like that is mounted in a position in which a wired connection is difficult or battery mounting is inefficient. For example, it may be assumed that the system has the power transmission unit mounted on the wheel housing, the power reception unit, sensor, or the like mounted inside the wheel or tire.

As described above, the system 1000 and method for measuring a load using the optimal resonant frequency search wireless power transmission system 10 according to an embodiment of the present invention, relates to a system and method for measuring a load, using the optimal resonant frequency search wireless power transmission system 10, provided with the power transmission unit 100 and the power reception unit 200, for searching for and obtaining an optimal resonant frequency according to a system frequency variation. The present invention provides a system and method for searching for an optimal resonant frequency by varying a system frequency at a time of load change and measuring a load from an amount of change in the power transmission distance d calculated according to a value of the change in the optimal resonant frequency obtained by the search, in the magnetic resonant wireless power transmission system 10 provided with the power transmission unit (Tx) 100 and the power reception unit (Rx) 200 installed in a vehicle having a variable vehicle height according to a load of the vehicle including a loaded cargo.

That is, the present invention may not only provide the wireless power transmission system 10 having maximum power transmission efficiency by effectively searching for an optimal resonant frequency by the system frequency variation to supply wireless power to various sensors (e.g., air pressure sensor or the like) mounted on the wheels and wheel housings of a vehicle, but also provide the system and method for accurately and effectively measuring a load using the wireless power transmission system 10 without additional sensors or devices.

More specifically, as illustrated in FIGS. 1 and 2, step (a) is a step of searching for an optimal resonant frequency according to a change in the power transmission distance d using a frequency variation at a time of load change (S100), in which the power transmission unit 100 may vary the system frequency within a preset frequency variation range to transmit power to the power reception unit 200, and a resonant frequency may be determined as an optimal resonant frequency when an output voltage value measured at the power reception unit 200 is equal to or greater than a preset receiving voltage determination value, and a resonant frequency of a maximum value of the at least one power transmitting efficiency calculated using the current value of the power transmission unit 100 and the output current value and the output voltage value of the power reception unit 200 that are measured at the resonant frequency may be determined as the optimal resonant frequency. A process (step (a) (S100)) of using the system and method for searching for an optimal resonant frequency using the system frequency variation as described above will be described in more detail with reference to FIGS. 6 to 14.

Step (b) (S200) is a step of deriving an optimal resonant frequency variation relationship according to the change in the power transmission distance d. When the process of searching for the optimal resonant frequency using the system frequency variation in step (a) is carried out while changing the power transmission distance d, a relationship graph for a change in the optimal resonant frequency according to the change in the power transmission distance d may be derived.

As illustrated in FIG. 3, when the process of searching for the optimal resonant frequency through the system frequency variation in step (a) is carried out by changing the power transmission distance d, the relationship between the power transmission distance d and the optimal resonant frequency may be approximated by a quadratic expression, and through such a relationship graph, the variation relationship of the optimal resonant frequency according to the change in the power transmission distance d in step (b) may be derived.

Since the variation relationship of the optimal resonant frequency according to the change in the power transmission distance d can be confirmed, and conversely, the change in the power transmission distance d according to the optimal resonant frequency can be found, it is possible to calculate the amount of change in the power transmission distance d corresponding to the amount of compression of the rigid structure through steps (a) and (b) described above at a time of load change in an embodiment of the present invention.

Step (c) is a step of calculating the amount of change in the power transmission distance d from the variation relationship derived in step (b) (S400), and deriving a load from the amount of change in the power transmission distance d. Since the amount of change in the power transmission distance d is equal to the amount of compression of the rigid structure that appears when the load changes, the amount of compression of the rigid structure is proportional to the load, and thus the load may be calculated or measured upon knowing a stiffness constant k corresponding to the proportionality constant (S500).

That is, as illustrated in FIG. 4, in the wireless power transmission system 10 according to an embodiment of the present invention, when the optimal resonant frequency having the maximum power transmission efficiency is searched for and found under the condition that the output of the power reception unit (Rx) 200 is constant, the amount of change in the power transmission distance d due to the change in the optimal resonant frequency may be calculated using the relationship graph data in FIG. 3 that has been previously confirmed, and the load measurement unit 20 may accurately and effectively measure the load using [Equation 1] below from the calculated amount of change in the power transmission distance d.

Amount of change in power transmission distance
$(\Delta d) = $[Spring constant $(k)$]×[Amount of change in load $(\Delta G)$]      [Equation 1]

(Here, d represents the power transmission distance d corresponding to a distance between the power transmission unit (Tx) and the power reception unit (Rx) 200, k represents a stiffness constant of the rigid structure, and the amount of change in load ($\Delta$) represents an amount of change in load at a time of load change).

As described above, as illustrated in FIG. 4, in a system in which the power transmission unit (Tx) 100 and the power reception unit (Rx) 200 are connected by a structure having a spring stiffness, such as a vehicle, the relationship of [Equation 1] is shown, in which the power transmission distance d changes in proportion to the load change, so that the load may be measured accurately and effectively because it is possible to know the amount of change in the load by knowing the amount of change in the power transmission distance d.

FIG. 5 is a schematic view illustrating an example of an application of the system 1000 and method for measuring a load using the optimal resonant frequency search wireless power transmission system 10 to a vehicle, according to an embodiment of the present invention. As illustrated in FIG. 5, the tires of a vehicle, such as a truck, may be connected to the vehicle structure through a shock observer having a spring stiffness. That is, the magnetic resonant wireless power transmission system 10 may be provided in which the power transmission unit (Tx) 100 is installed in the wheel housing of the wheel, and the power reception unit (Rx) 200 is installed inside the wheel.

That is, when the vehicle is loaded, there is a change in a distance between the vehicle body and the tire, that is, the power transmission distance d, depending on the spring stiffness in proportion to the load. As illustrated in FIG. 5, with the power transmission unit (Tx) 100 mounted to the vehicle body at the top of the tire and the power reception unit (Rx) 200 attached to the inner liner inside the tire, it is possible to calculate or measure the power transmission distance d from the relationship between the optimum resonant frequency and the power transmission distance d and to measure the amount of change (increase or decrease) of the load through the measured amount of change in the power transmission distance d when the optimal resonant frequency having a maximum efficiency is searched for through the process of searching for the optimum resonant frequency described above.

As described above, the system 1000 and method for measuring a load using the optimal resonant frequency search wireless power transmission system 10 according to an embodiment of the present invention can measure the load of a vehicle as additional information without being provided with an additional tire pressure sensor while supplying power to various sensors such as a tire acceleration sensor constituted in connection with the power reception unit 200.

Further, in the case of measuring the load of a vehicle, which needs to be essentially performed when entering and exiting a construction site or entering specific roads and bridges or depending on the traveling situation, there is a great advantage in that it is possible to easily measure the load of a vehicle, such as a truck, without additionally installing a separate, large and expensive special truck load measurement device, when using the system 1000 and method for measuring the load of a vehicle using the optimal resonant frequency search wireless power transmission system 10 according to an embodiment of the present invention. In addition, the system, as described above, according to an embodiment of the present invention may be used in conjunction with a traffic communication system to use various information, such as information on loads on the vehicles, such as trucks traveling on the road.

Figure 6:
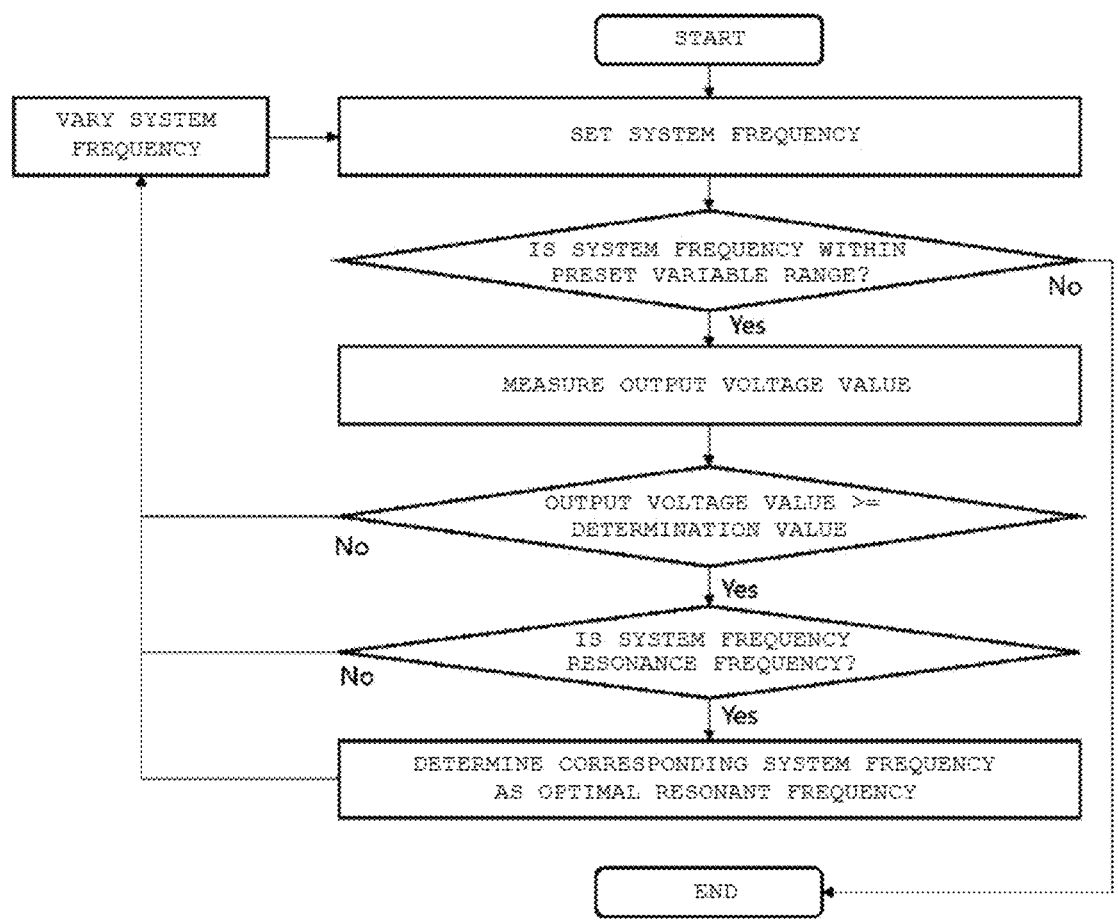
FIG. 6 is a flowchart illustrating a method of searching for an optimal resonant frequency for maximum power transmission according to an embodiment of the present invention.
Figure 7:
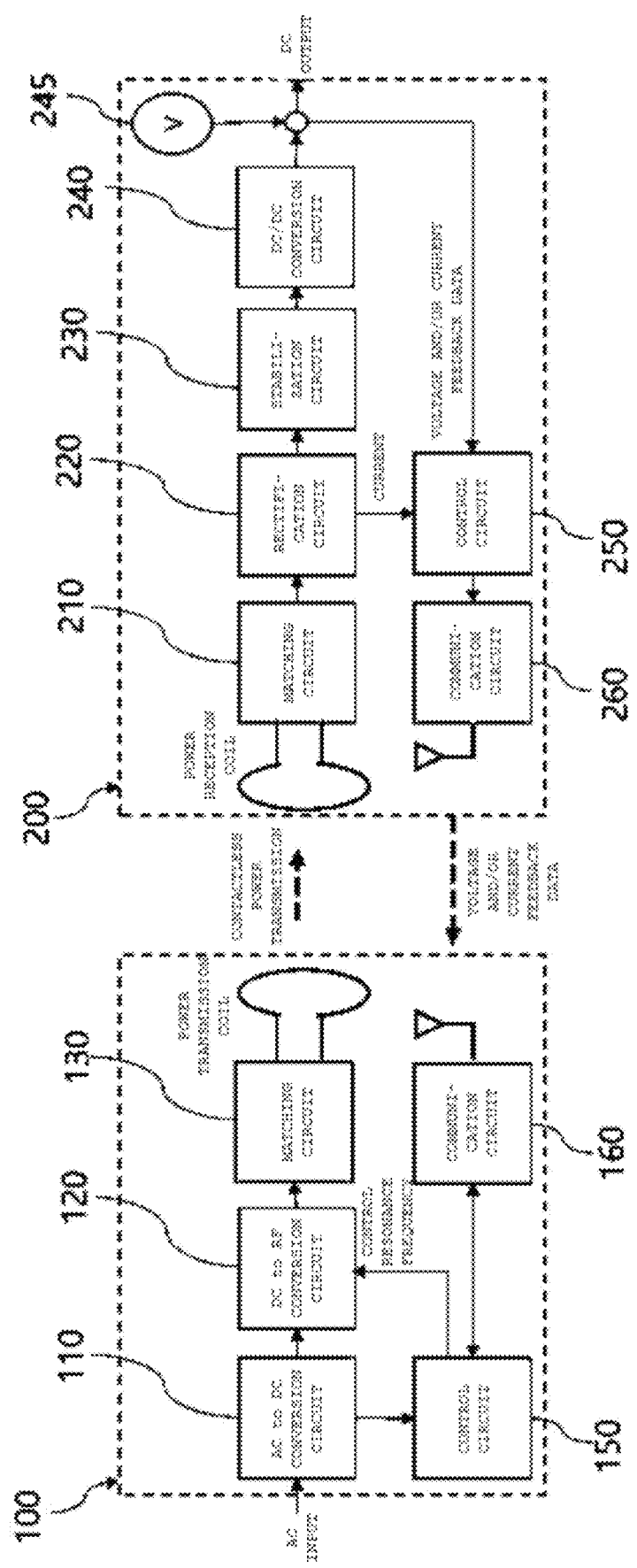
FIG. 7 illustrates a block diagram of a wireless power transmission system 10 for searching for an optimal resonant frequency, which is applied to the method of searching for an optimal resonant frequency for maximum power transmission according to an embodiment of the present invention exemplified in FIG. 6.
Figure 8:
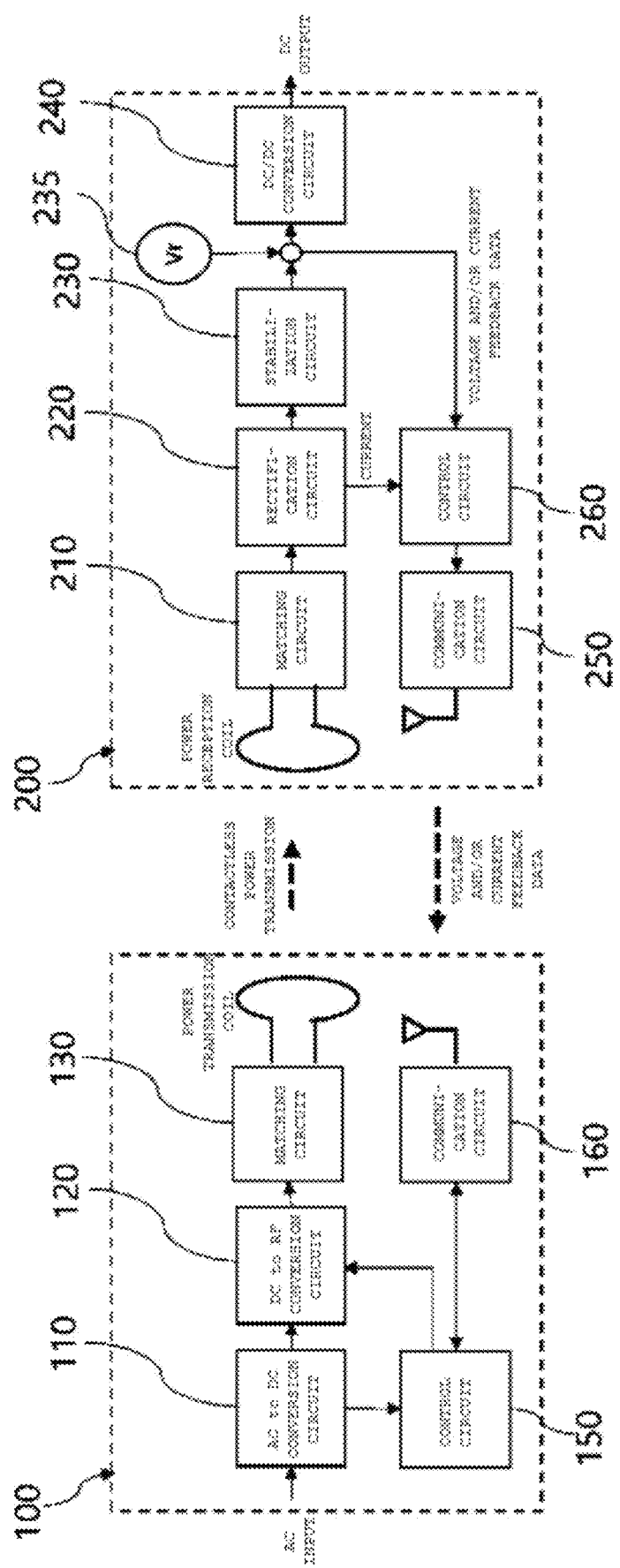
FIG. 8 illustrates a block diagram of a wireless power transmission system for searching for an optimal resonant frequency, which is applied to a method of searching for an optimal resonant frequency for maximum power transmission according to another embodiment of FIG. 6.

FIG. 6 is a flowchart illustrating a method of searching for an optimal resonant frequency for maximum power transmission according to an embodiment of the present invention, FIG. 7 illustrates a block diagram of a wireless power transmission system 10 for searching for an optimal resonant frequency, which is applied to the method of searching for an optimal resonant frequency for maximum power transmission according to an embodiment of the present invention exemplified in FIG. 6, and FIG. 8 illustrates a block diagram of the wireless power transmission system 10 for searching for an optimal resonant frequency, which is applied to a method of searching for an optimal resonant frequency for maximum power transmission according to another embodiment of FIG. 6.

As illustrated in FIG. 6, there is provided a method of searching for an optimal resonant frequency for maximum power transmission according to an embodiment of the present invention, in a method of searching for a resonant frequency of a wireless power transmission system 10 using magnetic resonant coupling of a power transmission unit 100 and a power reception unit 200, the method may include (a1-1) setting a system frequency within a preset frequency variable range and transmitting power from the power transmission unit 100 to the power reception unit 200, (a1-2) measuring an output voltage value of the power reception unit 200 according to the system frequency that is set, (a1-3) determining a resonant frequency as an optimal resonant frequency when the measured output voltage value is equal to or greater than a preset receiving voltage determination value, and (a1-4) repeating steps from step (a1-1) by varying the system frequency within the frequency variable range.

As described above, the present invention proposes a method of searching for an optimum resonant frequency, which measures an output voltage value by varying a frequency within a preset system frequency and determines a resonant frequency as an optimal resonant frequency when the measured output voltage value is equal to or greater than a preset determination value in the wireless power transmission system 10 using the magnetic resonant coupling of the power transmission unit 100 and the power reception unit 200. Accordingly, the present invention provides a system and method of searching for an optimal resonant frequency for maximum power transmission with a simple system configuration and method.

Further, as illustrated in FIG. 6, when the power transmission unit (Tx) and the power reception unit (Rx) are installed on a plurality of wheels and wheel housings, and a plurality of load measurement values are calculated by searching for a resonant frequency through each of the power transmission unit (Tx) and the power reception unit (Rx), an average value of the plurality of measurement values may be determined as a final load value in order to increase the reliability of the calculated load measurement value even in the presence of a source of error in the load value, such as the load eccentricity of the vehicle.

The system for searching for an optimal resonant frequency illustrated in FIGS. 7 and 8 may be a system according to the respective embodiments for which the method of searching for an optimal resonant frequency for maximum power transmission according to an embodiment of the present invention in FIG. 6 is applied.

As illustrated in FIG. 7, a system for searching for an optimal resonant frequency according to an embodiment of the present invention is the wireless power transmission system 10 using a magnetic resonant coupling, the system may include the power transmission unit 100 that includes an AC/DC conversion circuit 110, a DC/RF conversion circuit 120, a matching circuit 130, a control circuit 150, and a communication circuit 160 to transmit power; and the power reception unit 200 that includes a matching circuit 210, a rectification circuit 220, a stabilization circuit 230, a DC/DC conversion circuit 240, a control circuit 250, and a communication circuit 260.

Further, the aforementioned power transmission unit 100 transmits power to the power reception unit 200 by varying the system frequency within the preset frequency variable range, and when the output voltage value measured at the power reception unit 200 is equal to or greater than the preset receiving voltage determination value, a resonant frequency of a maximum value of at least one power transmission efficiency calculated using a current value and voltage value of the power transmission unit 100 measured at the resonant frequency and an output current value and an output voltage value of the power reception unit 200 may be determined as an optimal resonant frequency.

First, the wireless power transmission system 10 applied to an embodiment of the present invention may be configured with the power transmission unit 100 to transmit power and the power reception unit 200, which is positioned within a transmission distance d and receives the transmitted power from the aforementioned power transmission unit 100 through a magnetic resonance effect.

The power transmission unit 100 may be configured to include the AC/DC conversion circuit 110 that converts an AC input current to DC, the DC/RF conversion circuit 120 that converts the DC converted by the DC conversion circuit to RF, the control circuit 150 that controls the resonant frequency when converting the DC to RF power, the matching circuit 130 for magnetic resonance coupling, a power transmission coil connected to the matching circuit 130, and the communication circuit 160 that transmits and receives voltage or current signals.

The power reception unit 200 may be configured to include a power reception coil that causes coupling within a predetermined transmission distance with the aforementioned power transmission coil, a resonant circuit that causes a magnetic resonance effect, including the matching circuit 210, the rectification circuit 220 that rectifies a high frequency reception power signal at a downstream terminal of the resonant circuit, the voltage stabilization circuit 230 that stabilizes an output voltage rectified at a downstream terminal of the rectification circuit 220, the DC/DC conversion circuit 240 that outputs a predetermined voltage from the voltage stabilized at a downstream terminal of the voltage stabilization circuit 230, the control circuit 250 that receives a current signal from the aforementioned rectification circuit 220 and a voltage and/or current signal received at an output terminal of the DC/DC conversion circuit 240, and generates a feedback control signal, and the communication circuit 260 that transmits the feedback control signal to the communication circuit 160 of the power transmission unit 100.

The system for searching for an optimal resonant frequency according to an embodiment of the present invention illustrated in FIG. 7 is a first system for which the method of searching for an optimal resonant frequency of FIG. 1 is applied, and may measure an output voltage (V) at an output end of the DC/DC conversion circuit 240 of the power reception unit 200 while varying the system frequency within a preset frequency variable range through the control circuit of the power transmission unit 100, and determine a resonant frequency as an optimal resonant frequency when the measured output voltage is equal to or greater than a preset determination voltage.

The system for searching for an optimal resonant frequency according to an embodiment of the present invention illustrated in FIG. 8 is a second system of another embodiment for which the method of searching for an optimal resonant frequency of FIG. 6 is applied, and may measure a stabilization output voltage Vr between the stabilization circuit 230 and the DC/DC conversion circuit 240 of the power reception unit 200 while varying the system frequency within a preset frequency variable range through the control circuit 150 of the power transmission unit 100, and determine a resonant frequency as an optimal resonant frequency when the measured stabilization output voltage Vr is equal to or greater than a preset output voltage determination value.

Hereinafter, the method of searching for an optimal resonant frequency for maximum power transmission according to an embodiment of the present invention illustrated in FIG. 6 will be described in detail with the first system and the second system as described above being applied.

First, the system frequency is set to a frequency within the preset frequency variable range through the control circuit of the power transmission unit 100 of the first system and the second system, and power is transmitted to the power reception unit 200 through the matching circuit 130 and the power transmission coil. The power is received through the resonant circuit including the power reception coil and the matching circuit 210 of the power reception unit 200, the power is output through the rectification circuit 220, the stabilization circuit 230, and the DC/DC conversion circuit 240, the output voltage value is measured through a stabilization voltmeter 235 at the output end of the DC/DC conversion circuit 240, and the measured signal is transmitted to the power transmission unit 100 through the control circuit 260 and the communication circuit 250.

When an output voltage value received by the control circuit 150 of the power transmission unit 100 is compared with a preset output voltage determination value, and the output voltage value is equal to or greater than the determination value and the system frequency is a resonant frequency, the system frequency may be determined as an optimal resonant frequency. Then, the first system and the second system may repeat the process as described above while again varying the system frequency within the preset frequency variable range to search for and determine at least one optimal resonant frequency, as illustrated in FIG. 1.

Here, the variation of the system frequency may be an upward variation, where the system frequency varies to a higher frequency than the system frequency of the previous step, or a downward variation, where the system frequency varies to a lower frequency than the system frequency of the previous step.

That is, as illustrated in FIG. 6, when the output voltage value received by the control circuit 150 of the power transmission unit 100 from the power reception unit 200 is not equal to or greater than the preset output voltage determination value, or when the system frequency is not a resonant frequency, or after determining the corresponding system frequency as an optimal resonant frequency, the control circuit 150 may again vary the system frequency to another frequency within the preset variable range, which may be the downward variation to make the system frequency fall from a largest frequency of the preset variable range, or the upward variation to make the system frequency rise from a lowest frequency of the preset variable range.

In the wireless power transmission system, the resonant frequency when the power transmission efficiency is highest may be idealized as an optimal resonant frequency. However, at least one resonant frequency may be set or determined as an optimal resonant frequency in consideration of an output voltage of the system, operational efficiency, and the like. In addition, as a method of searching for and finding an optimal resonant frequency, a method of searching for an optimal resonant frequency by varying a frequency from a lowest system frequency to a higher frequency and a method of searching for an optimal resonant frequency by varying a frequency from a highest system frequency to a lower frequency may be applied. Therefore, the optimal resonant frequencies searched through the two methods may be different.

In addition, it is desirable to vary the system frequency within a preset frequency variable range at preset time intervals. To this end, the optimal resonant frequency for maximum power transmission may be searched quickly, reliably, and efficiently by varying the system frequency at preset frequency intervals, since searching for the optimal resonant frequency by continuous frequency variation not only takes a long time to search but also may increase the probability of error occurrence with a large burden on the search system due to frequent changes in the system frequency.

Further, as illustrated in FIG. 6, in an embodiment of the present invention, when the system frequency is not a frequency within a preset variable range, the search process may be terminated, since this may be an error in setting the system frequency within the preset variable range, and there is no reason to search any further, given that the search is terminated and the frequency is outside the variable range.

In addition, with the method of searching for an optimal resonant frequency according to an embodiment of the present invention, the optimal resonant frequency may be searched by varying a power transmission distance d at a preset variable interval within a preset range of the power transmission distance d within which magnetic resonant coupling of the power transmission unit 100 and the power reception unit 200 is possible, which is intended to search for an optimal resonant frequency for maximum power transmission in an environment in which the power transmission distance d changes, in that in the wireless power transmission system 10 applicable to various systems or home appliances, a distance between the power transmission unit 100 and the power reception unit 200 may be variable.

Further, the output voltage value applied to the method of searching for an optimal resonant frequency according to an embodiment of the present invention may be a DC output voltage value V of the power reception unit 200 of the first system, and may be a stabilization output voltage value Vr of the power reception unit 200 of the second system.

As illustrated in FIG. 7, the output voltage value of the first system may be a value measured by a voltmeter 245 at an output terminal of the DC/DC conversion circuit 240, and as illustrated in FIG. 3, the stabilization output voltage value Vr of the second system may be a value measured by the stabilization voltmeter 235 between the stabilization circuit 230 and the DC/DC conversion circuit 240.

As illustrated in FIG. 8, the stabilization circuit 230 of the second system may be provided between the rectification circuit 220 and the DC/DC conversion circuit 240 of the power reception unit 200 to increase the output stability in order to prevent the risk of damage to elements caused by severe fluctuations in the output voltage value due to load fluctuations of the output terminal and to ensure system stability. In the case of the second system provided with the stabilization circuit 230 as described above, a more stable process of searching for an optimal resonant frequency may be proceeded by allowing the output voltage value to be the stabilization output voltage value Vr measured between the stabilization circuit 230 and the DC/DC conversion circuit 240.

Further, the receiving voltage determination value for the measured stabilization output voltage value Vr may be greater than the receiving voltage determination value for the measured DC output voltage value V. This is because the stabilization output voltage has the characteristic of increasing or decreasing in proportion to the amount of power received.

Figure 9:
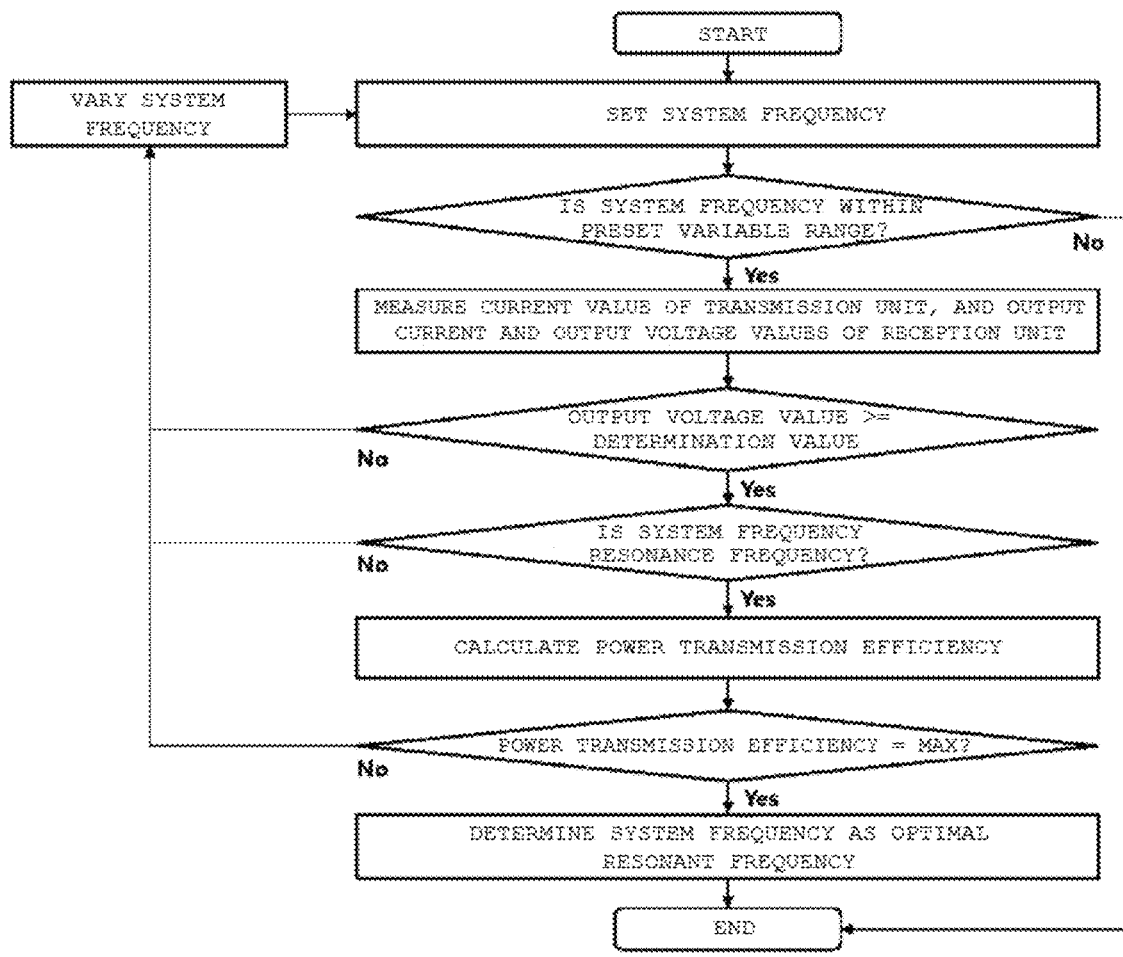
FIG. 9 illustrates a flowchart of the method of searching for an optimal resonant frequency for maximum power transmission according to another embodiment of the present invention.
Figure 10:
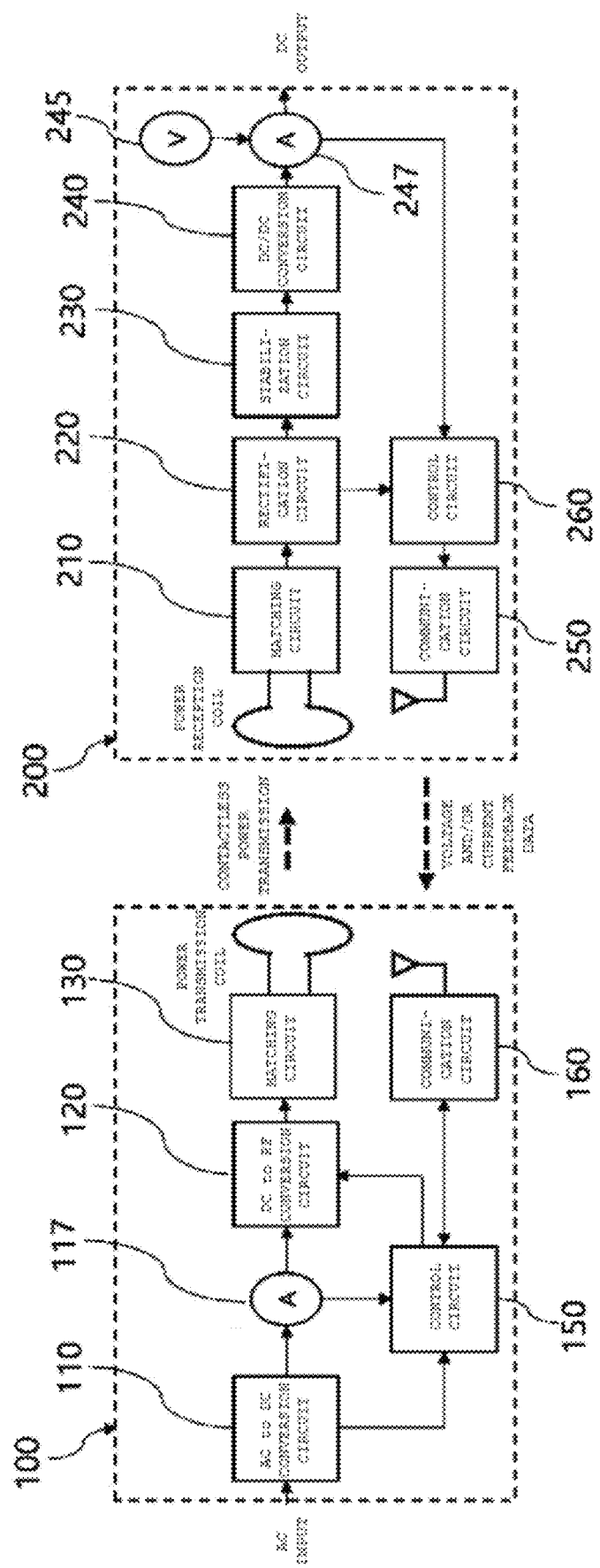
FIG. 10 illustrates a block diagram of a wireless power transmission system for searching for an optimal resonant frequency, which is applied to the method of searching for an optimal resonant frequency for maximum power transmission according to an embodiment of the present invention exemplified in FIG. 9.
Figure 11:
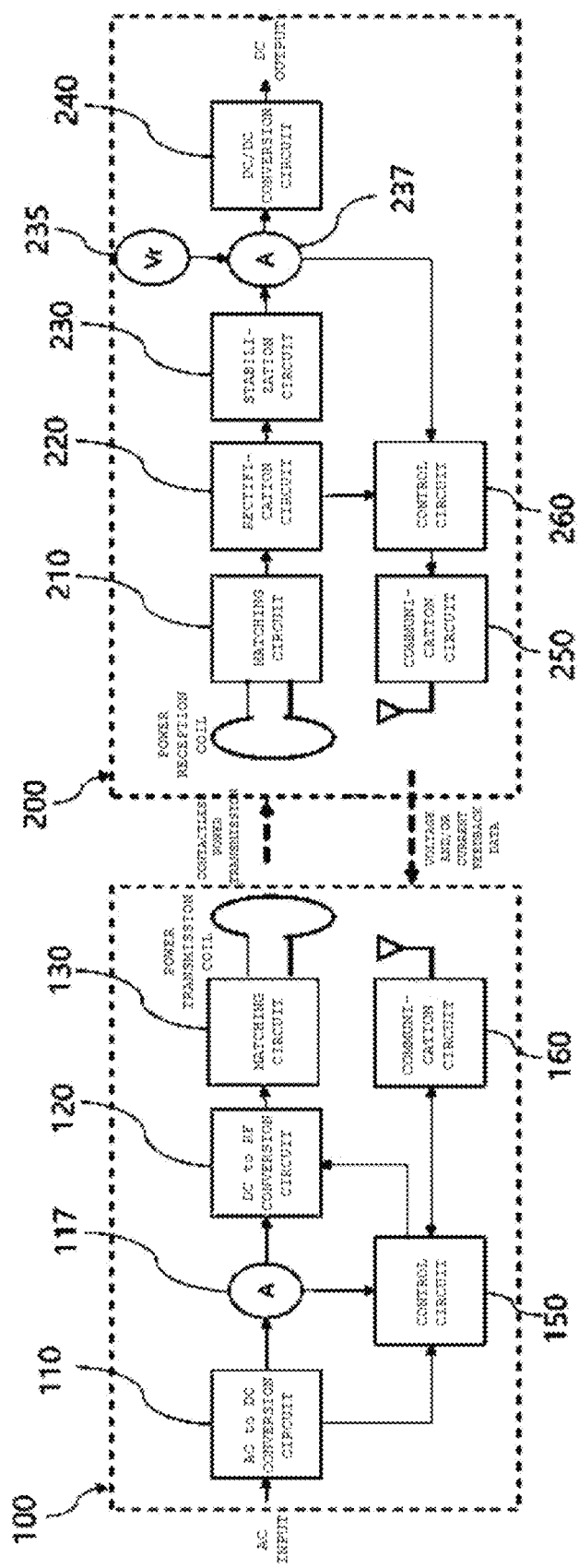
FIG. 11 illustrates a block diagram of a wireless power transmission system for searching for an optimal resonant frequency, which is applied to a method of searching for an optimal resonant frequency for maximum power transmission according to another embodiment of FIG. 9.

FIG. 9 illustrates a flowchart of the method of searching for an optimal resonant frequency for maximum power transmission according to another embodiment of the present invention, FIG. 10 illustrates a block diagram of the wireless power transmission system 10 for searching for an optimal resonant frequency, which is applied to the method of searching for an optimal resonant frequency for maximum power transmission according to an embodiment of the present invention exemplified in FIG. 9, and FIG. 11 illustrates a block diagram of the wireless power transmission system 10 for searching for an optimal resonant frequency, which is applied to a method of searching for an optimal resonant frequency for maximum power transmission according to another embodiment of FIG. 9.

The system for searching for an optimal resonant frequency according to an embodiment of the present invention illustrated in FIG. 10 is a third system for which the method of searching for an optimal resonant frequency of FIG. 9 is applied, and may measure an input current value A and the output voltage value V from the output terminal of the DC/DC conversion circuit 240 of the power reception unit 200 while varying the system frequency within a preset frequency variable range through the control circuit 150 of the power transmission unit 100, calculate power transmission efficiency through the input current value A and output voltage value V in the corresponding system frequency when the measured output voltage value Vr is equal to or greater than a preset reception voltage determination value, and determine a resonant frequency corresponding to a maximum value as an optimal resonant frequency.

Here, the current value of the power transmission unit 100 may be an input current value A measured between the AC/DC conversion circuit and the DC/RF conversion circuit, or an input current value A measured between the DC/RF conversion circuit and the matching circuit.

The system for searching for an optimal resonant frequency according to an embodiment of the present invention illustrated in FIG. 11 is a fourth system of still another embodiment for which the method of searching for an optimal resonant frequency of FIG. 9 is applied, and may measure the input current value A of the power transmission unit 100 and the stabilization output voltage value Vr between the stabilization circuit 230 and the DC/DC conversion circuit 240 of the power reception unit 200 while varying the system frequency within a preset frequency variable range through the control circuit 150 of the power transmission unit 100, calculate power transmission efficiency through the input current value A, and output current value A, and the stabilization output voltage value Vr in the corresponding system frequency when the measured stabilization output voltage value Vr is equal to or greater than the preset reception voltage determination value, and determine a resonant frequency corresponding to a maximum value as an optimal resonant frequency.

Hereinafter, using the third system of FIG. 10 and the fourth system of FIG. 11, a method of searching for an optimal resonant frequency for maximum power transmission according to an embodiment of the present invention illustrated in FIG. 9 will be described in detail.

As illustrated in FIG. 9, there is provided a method of searching for an optimal resonant frequency according to an embodiment of the present invention, in the method of searching for a resonant frequency in the wireless power transmission system 10 using the magnetic resonant coupling of the power transmission unit 100 and the power reception unit 200, the method may include (a2-1) setting a system frequency within a preset frequency variable range and transmitting power from the power transmission unit 100 to the power reception unit 200, (a2-2) measuring a current value of the power transmission unit 100, an output voltage value and an output current value of the power reception unit 200 according to the system frequency that is set, (a2-3) calculating power transmission efficiency using a current value and voltage value of the power transmission unit 100 measured at the resonant frequency, and an output voltage value and output current value of the power reception unit 200 measured at the resonant frequency, when the measured output voltage value is equal to or greater than a preset receiving voltage determination value, (a2-4) repeating steps starting from step (a2-1) by varying the system frequency within the frequency variable range, and (a2-5) determining a resonant frequency of a maximum value of the calculated power transmission efficiency as an optimal resonant frequency.

More specifically, the frequency within the preset system variable range is set as the system frequency and the power is transmitted through the power transmission unit 100. When the system frequency that is set does not correspond to a frequency within the preset variable range, the search of an optimal resonant frequency through the system is terminated. As described above, this is because the search process may be terminated when the system frequency that is set is a frequency that is incorrectly set outside the preset variable range, or when the search process that has been normally proceeded deviates from the variable range.

When the system frequency that is set corresponds to a frequency within the preset variable range, the input current values from the power transmission units of the third system and the fourth system are measured, and the output current and voltage values of the power reception unit 200 are measured.

When the measured output voltage value is equal to or greater than the preset receiving voltage determination value, it is determined whether the system frequency corresponds to the resonant frequency, and when the system frequency corresponds to the resonant frequency, the power transmission efficiency is calculated using the input current value measured at the power transmission unit 100 at the corresponding frequency and the current and voltage values measured at the power reception unit 200. Here, when the measured output voltage value is not equal to or greater than the preset receiving voltage determination value or when the system frequency is not the resonant frequency, the steps from the step of setting the system frequency described above are repeated again.

Further, it is determined whether the calculated power transmission efficiency is a maximum value, and when the calculated power transmission efficiency is not a maximum value, the steps from the step of setting the system frequency is repeated by varying the frequency, and when the power transmission efficiency is a maximum value, the corresponding system frequency or resonant frequency is determined as an optimal resonant frequency. Since the embodiments of the present invention, such as a range of setting of a frequency variable range, a search method according to a direction of varying the frequency, and a method of searching for an optimal frequency according to a variation of the power transmission distance, d are the same as the embodiment of FIG. 6, the description thereof will be omitted.

As described above, the method of searching for an optimal resonant frequency for maximum power transmission according to an embodiment of the present invention, in contrast to the embodiment of FIG. 6, has an advantage of more precisely and accurately searching for and finding an optimal resonant frequency, which may substantially increase the power transmission efficiency of the system, by proposing a search method of measuring an input current value, an output current value, and an output voltage value, calculating power transmission efficiency using the measured values, and determining a system frequency or resonant frequency corresponding to the maximum value of the calculated power transmission efficiency value as an optimal resonant frequency having maximum power transmission efficiency, and by proposing a method of more directly searching for an optimal resonant frequency for maximum power transmission.

Figure 12:
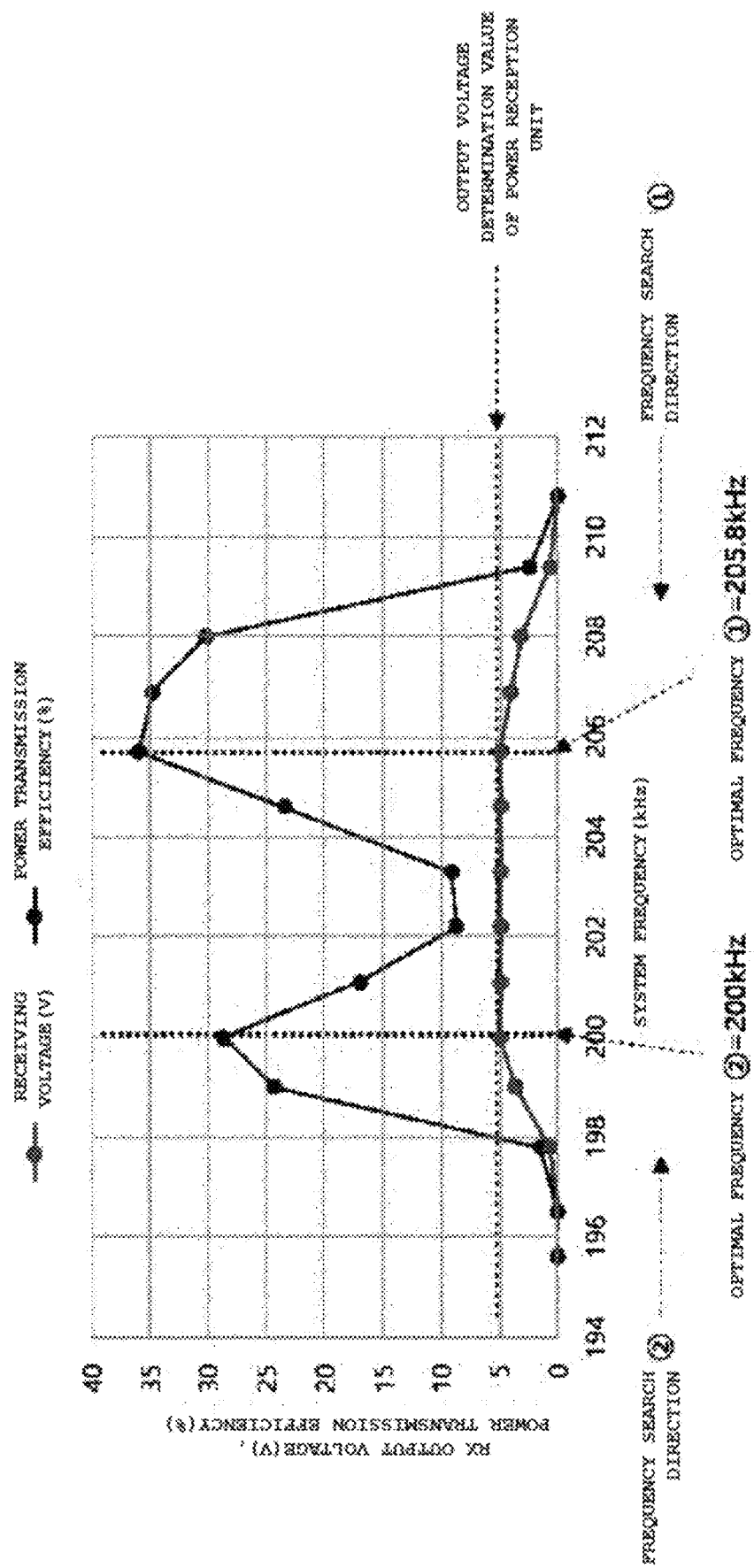
FIG. 12 is a graph illustrating response characteristics of an output voltage of a power reception unit and a transmission efficiency according to changes in frequency using the method of searching for an optimal resonant frequency according to an embodiment of the present invention.

FIG. 12 is a graph illustrating response characteristics of an output voltage of a power reception unit and a transmission efficiency according to changes in frequency using the method of searching for an optimal resonant frequency according to an embodiment of the present invention.

FIG. 12 is a graph illustrating a response characteristic of the received voltage and transmission efficiency according to a frequency change of a system in which the matching circuit is optimized for a resonant frequency of 205.8 kHz and the power transmission distance d of 80 mm. As illustrated in FIG. 7, ① a downward variation method, which varies a frequency in the direction of decreasing a frequency from a highest frequency within a preset frequency variable range, and ② an upward variation method, which varies a frequency in the direction of increasing a frequency from a lowest frequency within a preset frequency variable range, may be applied as a search method of varying a frequency.

The preset frequency variable range is defined to be 185 kHz to 215 kHz, and the process of searching for an optimal resonant frequency according to the present embodiment is proceeded using the first system and the third system. When an optimal resonant frequency is searched by applying the downward variation method of ① at the highest frequency of 215 kHz, it can be seen that the output voltage of the power reception unit 200 has reached the preset output voltage determination value (5V) at 205.8 kHz, in which case the power transmission efficiency is maximized, so that the result of searching for the optimal resonant frequency of this system is determined to be 205.8 kHz.

In addition, when an optimal resonant frequency is searched by applying the upward variation method of ② at the lowest frequency of 185 kHz, it can be seen that the output voltage of the power reception unit 200 has reached the preset output voltage determination value (5V) at 200 kHz, in which case the power transmission efficiency is maximized, so that the result of searching for the optimal resonant frequency of this system is determined to be 200 KHz.

As described above, as the wireless power transmission system 10 and method for searching for an optimal resonant frequency using the system frequency variation exemplified in FIGS. 6 to 11, the process of searching for an optimal resonant frequency in step (a) exemplified in FIGS. 1 and 2 may be effectively carried out to provide the system 10 and method for transmitting wireless power with maximum efficiency, and the system 1000 and method for measuring a load using the same is described above in FIGS. 1 to 5.

Figure 13:
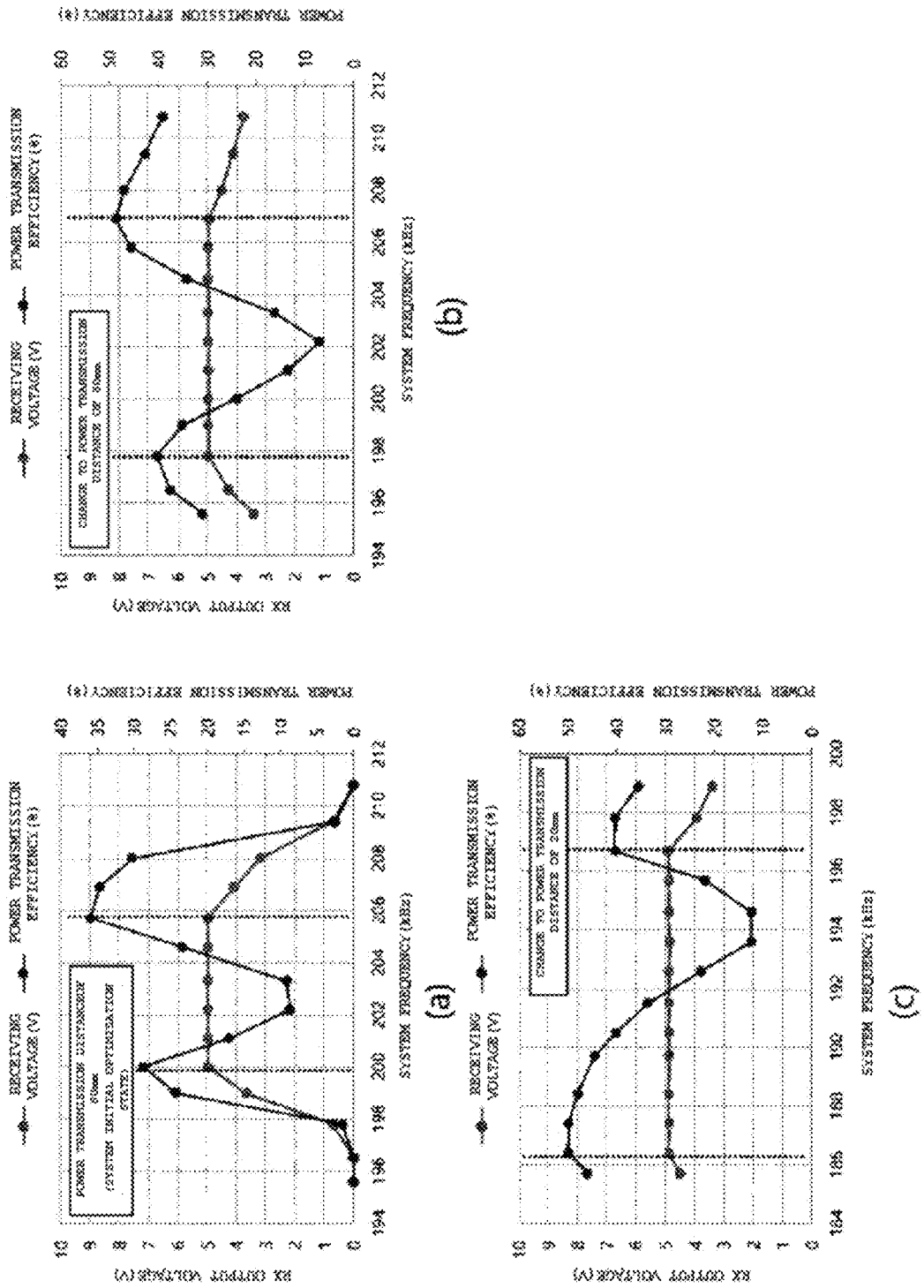
FIG. 13 is graphs illustrating response characteristics of the output voltage of the power reception unit and transmission efficiency according to changes in frequency using the method of searching for an optimal resonant frequency according to an embodiment of the present invention, and illustrates graphs of frequency response characteristics of searching for an optimal resonant frequency while decreasing a transmission distance.

FIG. 13 is graphs illustrating response characteristics of the output voltage of the power reception unit 200 and transmission efficiency according to changes in frequency using the method of searching for an optimal resonant frequency according to an embodiment of the present invention, and illustrates graphs of frequency response characteristics of searching for an optimal resonant frequency while decreasing the power transmission distance d.

FIG. 13A is a graph illustrating the output voltage of the power reception unit 200 and the response characteristics of the transmission efficiency according to changes in frequency at the power transmission distance d of 80 mm, FIG. 13B is a graph illustrating the output voltage of the power reception unit 200 and the response characteristics of the transmission efficiency according to changes in frequency at the power transmission distance d of 60 mm, and FIG. 13C is a graph illustrating the output voltage of the power reception unit 200 and the response characteristics of the transmission efficiency according to changes in frequency at the power transmission distance d of 20 mm.

As illustrated in FIG. 13, the method of searching for an optimal resonant frequency according to an embodiment of the present invention is to use the first system or the second system, and may be applied with either the downward variation method of searching for a frequency of ① or the upward variation method of searching for a frequency of ②, in cases when the system is initially matched and optimized to 205.8 kHz at the power transmission distance d of 80 mm (FIG. 13A), and when an optimal resonant frequency is re-searched at different conditions of the power transmission distance d of 60 mm (FIG. 13B) and 20 mm (FIG. 13C). An optimal resonant frequency corresponding to each of the search conditions with different transmission distances d may be found, and it can be seen that the optimal resonant frequency becomes smaller proportionally as the power transmission distance d becomes smaller, and it can be seen that the frequency range between the optimal resonance frequencies searched by the methods of ① and ② becomes wider as the power transmission distance d becomes smaller according to each condition. That is, it can be seen that the optimal resonant frequency may appear over a wide range as the power transmission distance d gets closer.

That is, as illustrated in FIG. 13, it can be seen that the results of an optimized resonant frequency that meets all the search conditions may be searched and found (Red dotted line). Here, the output voltage determination value of the power reception unit 200 for the search of an optimal resonant frequency is exemplified as 5V.

Figure 14:
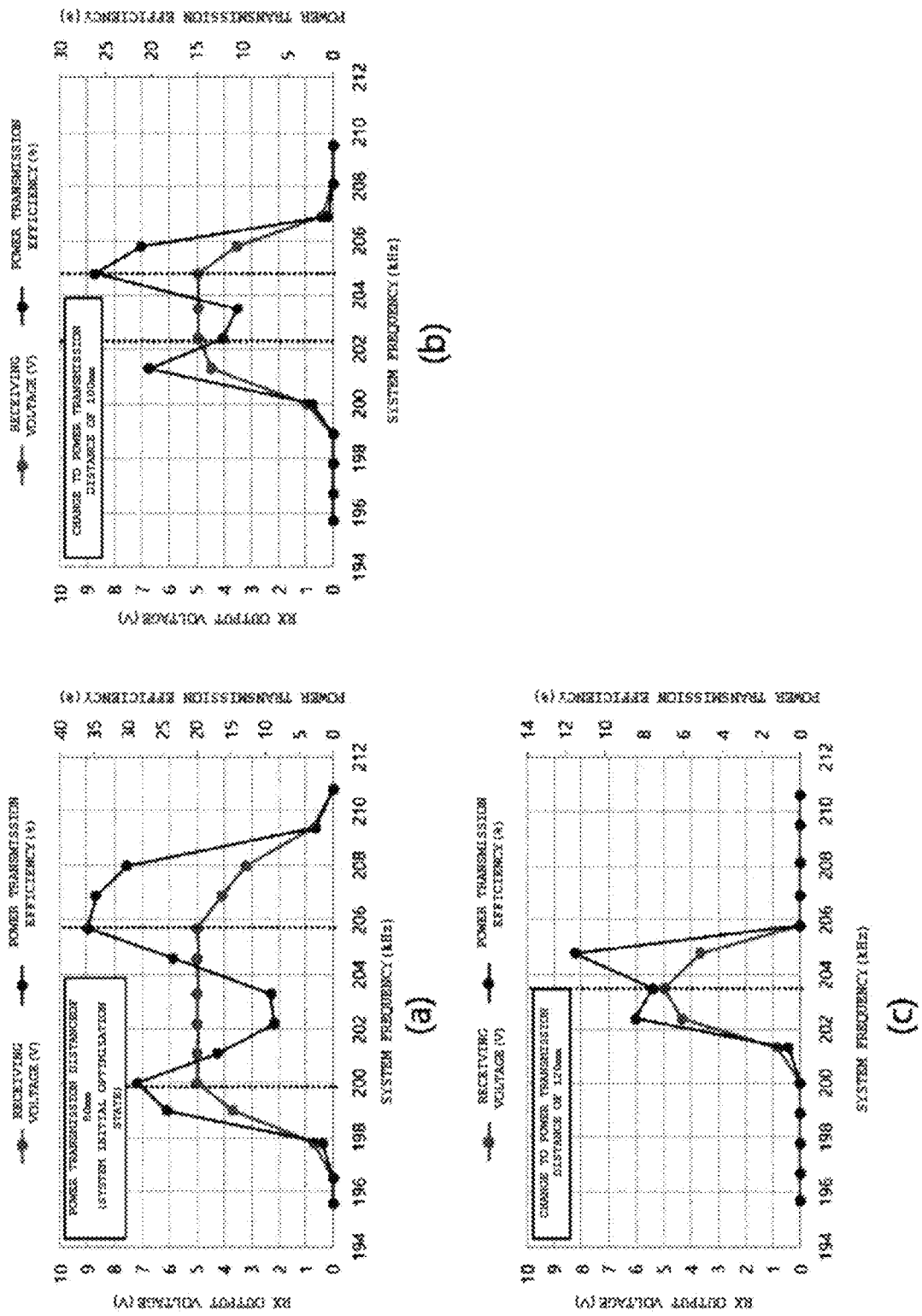
FIG. 14 is graphs illustrating response characteristics of the output voltage of the power reception unit and transmission efficiency according to changes in frequency using the method of searching for an optimal resonant frequency according to an embodiment of the present invention, and illustrates graphs of frequency response characteristics of searching for an optimal resonant frequency while increasing a transmission distance.

FIG. 14 is graphs illustrating response characteristics of the output voltage of the power reception unit 200 and transmission efficiency according to changes in frequency using the method of searching for an optimal resonant frequency according to an embodiment of the present invention, and illustrates graphs of experimental response characteristics of searching for an optimal resonant frequency while increasing the power transmission distance d.

FIG. 14A is a graph illustrating the output voltage of the power reception unit 200 and the response characteristics of the transmission efficiency according to changes in frequency at the power transmission distance d of 80 mm, FIG. 14B is a graph illustrating the output voltage of the power reception unit 200 and the response characteristics of the transmission efficiency according to changes in frequency at the power transmission distance d of 100 mm, and FIG. 9C is a graph illustrating the output voltage of the power reception unit 200 and the response characteristics of the transmission efficiency according to changes in frequency at the power transmission distance d of 120 mm.

As illustrated in FIG. 14, the method of searching for an optimal resonant frequency according to an embodiment of the present invention uses the first system or the second system, and may be applied with either the downward variation method of searching for a frequency or the upward variation method of searching for a frequency, in cases when the system is initially matched and optimized to 205.8 kHz at the power transmission distance d of 80 mm (FIG. 14A), and when an optimal resonant frequency is re-searched at different conditions of the power transmission distance d of 100 mm (FIG. 14B) and 120 mm (FIG. 14C). An optimal resonant frequency corresponding to each of the search conditions with different transmission distances d may be found, and it can be seen that the frequency range between the optimal resonance frequencies searched by the methods of ① and ② is narrowing as the power transmission distance d becomes greater according to each condition. That is, it can be seen that as the power transmission distance d becomes shorter, the frequency range over which the output voltage is measured as the determination value widens because it becomes easier to receive power than the initially set system, and as the power transmission distance d becomes farther, the stable range of the output voltage tends to decrease because it becomes more difficult to receive power due to less magnetic coupling.

Therefore, when the system is designed, it is desirable to optimize the matching circuit with reference to a farthest power transmission distance d, and then operate the system to apply the method of searching for an optimal resonant frequency while reducing the power transmission distance d.

As described above, as illustrated in FIG. 13 and FIG. 14, the relationship of the optimal resonant frequency with the power transmission distance d may be known using the system 10 and method for transmitting a magnetic resonant wireless power according to an embodiment of the present invention, and this process is the same as the process in step (b) as exemplified in FIG. 1 (S200).

In order to search for an optimal resonant frequency for transmitting maximum power to the power transmission system as described above, at an initial setting after replacing a tire, a frequency is varied and an optimal resonant frequency is searched according to the method of searching for an optimal resonant frequency according to an embodiment of the present invention, and wireless power having optimal power transmission efficiency may be supplied to various sensors installed on the wheels or wheel housing of an industrial vehicle such as a truck.

While the present invention has been described above with reference to the exemplary embodiments, it may be understood by those skilled in the art that the present invention may be variously modified and changed without departing from the spirit and scope of the present invention disclosed in the claims. Therefore, it should be understood that any modified embodiment that essentially includes the constituent elements of the claims of the present invention is included in the technical scope of the present invention.

The invention claimed is:

1. A method of measuring a load of a vehicle using an optimal resonant frequency search wireless power transmission system, in a method of measuring a load using a magnetic resonant wireless power transmission system that is installed in a vehicle having a vehicle height that varies according to the load of the vehicle including a loaded cargo, and is provided with a power transmission unit (Tx) and a power reception unit (Rx), the method comprising:
(a) searching for an optimal resonant frequency according to a change in a power transmission distance using a system frequency variation according to a change in the load of the vehicle;
(b) deriving an optimal resonant frequency variation relationship according to the change in the power transmission distance; and
(c) calculating an amount of change in power transmission distance from the variation relationship, and deriving the load from the amount of change in power transmission distance.

2. The method of claim 1, wherein the wireless power transmission system is a magnetic resonant wireless power transmission system provided with the power transmission unit (Tx) mounted on a wheel housing of the vehicle and the power reception unit (Rx) mounted inside a tire of a wheel.

3. The method of claim 2, comprising:
determining a value of the load is determined to be an average value of a plurality of load measurement values when the power transmission unit (Tx) and the power reception unit (Rx) are installed in a plurality of wheels and wheel housings, and the plurality of load measurement values are calculated.

4. The method of claim 1, wherein step (a) includes:
(a1-1) setting a system frequency within a preset frequency variable range and transmitting power from the power transmission unit to the power reception unit;
(a1-2) measuring an output voltage value of the power reception unit according to the system frequency that is set;
(a1-3) determining a resonant frequency as an optimal resonant frequency when the measured output voltage value is equal to or greater than a preset receiving voltage determination value; and
(a1-4) repeating steps from step (a1-1) by varying the system frequency within the frequency variable range.

5. The method of claim 1, wherein step (a) includes:
(a2-1) setting a system frequency within a preset frequency variable range and transmitting power from the power transmission unit to the power reception unit;
(a2-2) measuring a current value of the power transmission unit, an output voltage value and an output current value of the power reception unit according to the system frequency that is set;
(a2-3) calculating power transmission efficiency using a current value and voltage value of the power transmission unit measured at the resonance frequency, and an output voltage value and output current value of the power reception unit measured at the resonance frequency, when the measured output voltage value is equal to or greater than a preset receiving voltage determination value;

(a2-4) repeating steps starting from step (a2-1) by varying the system frequency within the frequency variable range; and (a2-5) determining a resonance frequency of a maximum value of the calculated power transmission efficiency as an optimal resonance frequency.

6. The method of claim 1, wherein step (c) includes:

(c1) calculating an amount of change in power transmission distance according to the variation relationship from a value of the change in the obtained optimal resonant frequency; and (c2) deriving a load of an object mounted on the vehicle using the calculated amount of change in power transmission distance and a preset suspension spring constant k of the vehicle.

7. The method of claim 6, wherein the receiving voltage determination value for the measured stabilization output voltage value Vr is greater than the receiving voltage determination value for the measured DC output voltage value V.

8. A system for measuring a load of a vehicle using an optimal resonant frequency search wireless power transmission system, in a system for measuring a load using a magnetic resonant wireless power transmission system that is provided with a power transmission unit (Tx) and a power reception unit (Rx) installed in a vehicle having a vehicle height that varies according to the load of the vehicle including a loaded cargo, wherein the system includes the power transmission unit (Tx) provided with an AC/DC conversion circuit, a DC/RF conversion circuit, a matching circuit, a control circuit, and a communication circuit, and the power reception unit (Rx), which is mounted inside a tire and includes a matching circuit, a rectification circuit, a stabilization circuit, a DC/DC conversion circuit, a control circuit, and a communication circuit to receive power from the power transmission unit (Tx), the system comprising:

an optimal resonant frequency search wireless power transmission system configured to search for and determine an optimal resonant frequency by varying a system frequency; and a load measurement unit configured to derive an optimal frequency variation relationship according to a change in power transmission distance caused by a load change of the vehicle using a frequency variation at a time of the load change, and to measure the load from an amount of change in power transmission distance calculated from the variation relationship.

9. The system of claim 8, wherein the magnetic resonant wireless power transmission system is a magnetic resonant wireless power transmission system provided with the power transmission unit (Tx) mounted on a wheel housing of the vehicle and the power reception unit (Rx) mounted inside a tire of a wheel.

10. The system of claim 8, wherein, the optimal resonant frequency search wireless power transmission system transmits, by the power transmission unit, power to the power reception unit by varying the system frequency within a preset frequency variation range, and determines at least one of resonant frequencies to be an optimal resonant frequency when an output voltage value measured in the power reception unit is equal to or greater than a preset receiving voltage determination value.

11. The system of claim 8, wherein the optimal resonant frequency search wireless power transmission system transmits, by the power transmission unit, power to the power reception unit by varying the system frequency within a preset frequency variation range, and determines a resonant frequency of a maximum value of at least one power transmission efficiency calculated using a current value and a voltage value of the power transmission unit and an output current value and an output voltage value of the power reception unit that are measured at the resonant frequency to be an optimal resonant frequency when the output voltage value measured in the power reception unit is equal to or greater than a preset receiving voltage determination value.

12. The system of claim 10 or 11, wherein the output voltage value is a DC output voltage value V or a stabilization output voltage value Vr measured between the stabilization circuit and the DC conversion circuit of the power reception unit.

13. The system of claim 11, wherein the current value of the power transmission unit is an input current value A measured between the AC/DC conversion circuit and the DC/RF conversion circuit, or measured between the DC/RF conversion circuit and the matching circuit.

14. The system of claim 11, wherein the output voltage value is a DC output voltage value V or a stabilization output voltage value Vr measured between the stabilization circuit and the DC conversion circuit of the power reception unit.

* * * * *